United States Patent [19]
Brandestini

[11] Patent Number: 5,880,683
[45] Date of Patent: *Mar. 9, 1999

[54] ABSOLUTE DIGITAL POSITION ENCODER

[75] Inventor: Marco Brandestini, Montagnola, Switzerland

[73] Assignee: Bourns, Inc., Riverside, Calif.

[*] Notice: The term of this patent shall not extend beyond the expiration date of Pat. No. 5,519,393.

[21] Appl. No.: 899,407

[22] Filed: Jul. 23, 1997

Related U.S. Application Data

[63] Continuation of Ser. No. 377,377, Jan. 25, 1995, abandoned, which is a continuation-in-part of Ser. No. 201,739, Feb. 25, 1994, Pat. No. 5,519,393, which is a continuation-in-part of Ser. No. 96,047, Jul. 22, 1993, abandoned, said Ser. No. 377,377, is a continuation-in-part of Ser. No. 359,703, Dec. 20, 1994, Pat. No. 5,739,775.

[51] Int. Cl.⁶ .................................................. H03M 1/22
[52] U.S. Cl. ............................................. 341/10; 341/11
[58] Field of Search .................................. 341/6, 7, 8, 9, 341/10, 11, 13, 17

[56] References Cited

U.S. PATENT DOCUMENTS

| | | |
|---|---|---|
| 3,048,669 | 8/1962 | Mikkola et al. . |
| 3,531,798 | 9/1970 | Bureau ....................................... 341/11 |
| 3,659,083 | 4/1972 | Winter et al. . |
| 3,835,377 | 9/1974 | Kataoka . |
| 4,109,207 | 8/1978 | Petersen . |
| 4,345,240 | 8/1982 | Amano et al. . |
| 4,543,526 | 9/1985 | Burckhardt . |
| 4,806,837 | 2/1989 | Ito . |
| 4,878,013 | 10/1989 | Andermo . |
| 4,901,072 | 2/1990 | Fox . |
| 4,935,739 | 6/1990 | Humphrey . |
| 4,947,166 | 8/1990 | Wingate et al. . |
| 4,949,087 | 8/1990 | Miyazawa . |
| 5,029,304 | 7/1991 | Tolmie, Jr. . |
| 5,117,105 | 5/1992 | Nagase et al. . |
| 5,173,693 | 12/1992 | Fry ............................................. 341/11 |
| 5,298,698 | 3/1994 | Iida et al. . |
| 5,315,077 | 5/1994 | Simon et al. . |
| 5,438,193 | 8/1995 | Takagi et al. ............................. 341/13 |
| 5,519,393 | 5/1996 | Brandestini ............................... 341/11 |

FOREIGN PATENT DOCUMENTS

| | | |
|---|---|---|
| 0154654 | 9/1985 | European Pat. Off. . |
| 0332244 | 9/1989 | European Pat. Off. . |
| 0635700 | 1/1995 | European Pat. Off. . |
| 2638918 | 11/1988 | France . |
| 3035774 | 5/1982 | Germany . |
| 2066602 | 12/1979 | United Kingdom . |
| 2202677 | 3/1987 | United Kingdom . |
| 2226720 | 7/1990 | United Kingdom . |

OTHER PUBLICATIONS

Gilbert, E.N. "Gray Codes and Paths on the n–Cube", Bell Systems Technical Journal, May, 1958, pp. 815–826.

Ruskey, Frank et al., "Generating Necklaces", J. of Algorithms 13, 1992, pp. 414–430.

Stewart, Ian; "Game, Set & Math", Oxford Press, Cambridge, Massachusetts; 1989; pp. 42–54.

Doeblin, Ernest; "Measurement Systems"; McGraw–Hill Book Company, New York; 1983; pp. 294–299.

(List continued on next page.)

*Primary Examiner*—Howard L. Williams
*Attorney, Agent, or Firm*—Knobbe, Martens, Olson & Bear, LLP

[57] ABSTRACT

A method and apparatus to convert absolute angular or linear position to digital information utilizes a ternary coding scheme. The code is arranged along a single track. Sensors placed at essentially equal intervals distinguish three states per position. The sensor outputs are converted from ternary to binary data by combinatorial logic. The sensors may be mechanical contacts, optical detectors, magnetic detectors, or capacitive detectors. Such an encoder may be used as a potentiometer, multiposition switch replacement, shaft encoder, or length measurement device.

29 Claims, 14 Drawing Sheets

OTHER PUBLICATIONS

Heidenhein Marketing Brochure (except showing Model ROC 411) ; and attached English translation.

Vogt Advertisement; and English translation of text.

Ebe Product Announcement; and English translation of text.

Bourns Data Sheet for Digital Contacting Encoders.

EECO Catalog p. 545 showing PCB switches.

Hewlett Packard Catalog pp. 4–4 and 4–5 showing motion sensing and control devices.

G.C. Tootill, "The Use of Cyclic–Permuted Chain Codes For Digitisers", Royal Aircraft Establishment, Farnborough, Hants., England.

Preliminary Examination Report dated Apr. 4, 1997 for PCT Application No. US95/16815.

Maley et al., IBM Technical Disclosure Bulletin, vol. 14, No. 3, Aug. 1971, p. 734.

Patent Abstracts of Japan; vol. 10, No. 327, Nov. 7, 1986 JP–61–133 819 (1 page).

IEEE Transactions on Instrumentation and Measurement vol. 39, No. 5, Oct. 1990 (5 pages).

```
0 0 1 1 1 0 0 1 1 1 1 0 0 2 2 2 0 0 2 2 2 2
1 1 1 1 0 0 2 2 2 0 0 2 2 2 2 0 0 1 1 1 0 0 1
2 0 0 2 2 2 2 2 0 0 1 1 1 0 0 1 1 1 1 0 0 2 2
```

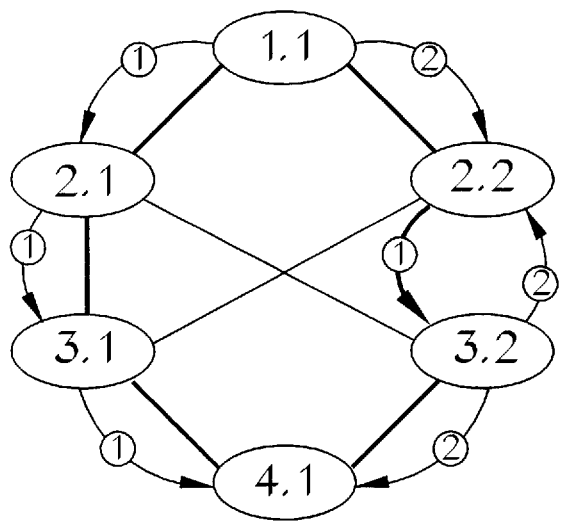

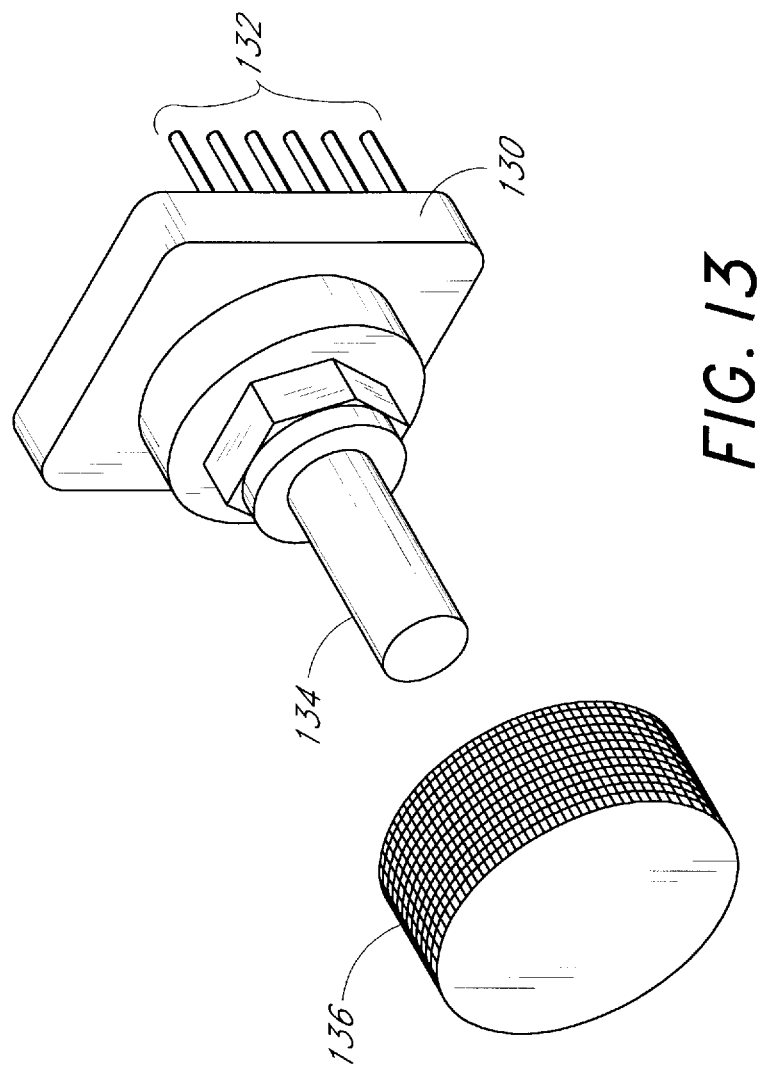

ABSOLUTE DIGITAL POSITION ENCODER

This application is a continuation of appl. Ser. No. 08/377,377 filed Jan. 25, 1995 (abandoned), which is a continuation-in-part of appl. Ser. No. 08/201,739 filed Feb. 25, 1994 (now U.S. Pat. No. 5,519,393), which is a continuation-in-part of appl. Ser. No. 08/096,047 filed Jul. 22, 1993 (abandoned). U.S. appl. Ser. No. 08/377,377 is also a continuation-in-part of appl. Ser. No. 08/359,703 filed Dec. 20, 1994 (now U.S. Pat. No. 5,739,775), which is hereby incorporated herein by reference.

FIELD OF THE INVENTION

This invention relates to the task of converting angular or linear mechanical position to a digital output and, more particularly, to an absolute digital position encoder having a single track.

BACKGROUND OF THE INVENTION

Presently, a number of schemes exist to convert angular or linear mechanical position to a digital output. The most simple converters are potentiometers, which convert position to an output voltage by acting as a resistive divider. Their analog output can then be converted to a digital format, if required. In a case calling for an output signal that consists of discrete steps, a multiposition switch is the present choice.

With the advance of microprocessor-based equipment, digital incremental encoders have emerged. They typically employ a single track and two sensors arranged to produce a pair of square wave patterns with a 90° phase shift. An up/down counter is connected to the sensor outputs to deliver position information. If a second track bearing an index marker is provided, the counter can be reset when the index position is sensed. Thus a quasi-absolute scheme results, in that accurate position information can be provided so long as power remains on, but after a power-up condition the position information is not accurate until a relative position is reached in which the index marker resets the counter.

Where true absolute information is required, for example where accurate position information is needed following a power-on condition without relative movement of the encoder parts, multitrack encoders are the most common choice. They typically feature a number of tracks equivalent to the $^2$log of the number of steps to be resolved, for example 8 tracks for a 256 step encoder. The aforementioned encoders most commonly utilize an optical scheme with a photographically fabricated coding wheel bearing a Gray code and LED/phototransistor combinations as detectors.

Since each track of a multitrack encoder contributes to the diameter of the device, it would be desirable, if possible, to reduce the number of tracks on the encoder without producing a corresponding reduction in the encoder's resolution. Although attempts have been made to design a Gray-coded absolute encoder that uses only a single track, these attempts have produced very inefficient encoders that utilize only a portion of the available output codes. For an n-sensor, binary, single-track (absolute) encoder, the best resolution that has heretofore been obtained is 4n (i.e., the number of output codes is equal to four times the number of sensors). See U.S. Pat. No. 5,029,304 to Tolmie, Jr., et. al. For a 5-sensor (or equivalently, five digit) binary encoder, for example, an encoder in accordance with the prior art would have a resolution of 4×5=20, and would thus utilize only 20 of the $2^n=2^5=32$ available output codes. This inefficiency becomes even more apparent as the number of sensors is increased. For a seven sensor binary encoder, for example, only 4×7=28 of the $2^7=128$ output codes would be used.

This inefficiency in existing single track Gray-coded absolute encoders translates into unnecessary hardware. For example, for an application that requires a 128 position encoder, a single track binary encoder in accordance with the prior art would have 128/4=32 sensors and output lines, in comparison with 7 sensors and output lines for a conventional multitrack encoder. Thus, multitrack encoders remain as the preferred choice over single-track encoders, especially where high resolutions (e.g., 60 or more positions) are required.

Other principles worth mentioning are inductive or capacitive resolvers. Both schemes are by nature analog; their two or three phase outputs can be digitized and the rotary angle computed from the respective signal amplitudes. Synchro resolvers are a good example of a three-phase inductive rotary encoder. An application for a linear encoder is found in digital calipers.

One object of the invention is to provide an encoding principle which can yield a digitized absolute angular or linear position.

Another object of the invention is to produce a single track Gray-coded encoder having a resolution that approaches or is equal to the resolution of a mutitrack encoder, without a corresponding increase in the number of sensors.

Another object of the invention is to provide a single track encoder design that can be implemented using binary, ternary and quaternary sensing techniques.

SUMMARY OF THE INVENTION

The objects and purposes of the invention, including those set forth above, are met according to one form of the present invention by providing a method of generating a numerical value representing an absolute position of a first member with respect to a second member where the first and second members are supported for relative movement, including the steps of: providing on the first member an elongate track having a code extending therealong; sensing the code at a plurality of locations on the second member which are adjacent the track at spaced locations therealong, the track moving past each location during relative movement of the first and second members; generating a set of digital values which each represent a currently-sensed code value at a respective one of the locations; and converting the set of digital values representing currently sensed code values into a final binary output representative of an absolute position of the first member with respect to the second member.

Another form of the present invention involves the provision of an apparatus which includes: a first member having thereon a track with a code extending therealong; a second member supported for movement relative to the first member and having thereon a plurality of sensors which are each adjacent the track at spaced locations therealong, the sensors each moving along the track in response to relative movement of the first and second members; and an electronic circuit which includes a first arrangement responsive to the sensors for generating a set of digital values each representing a currently-sensed code value from a respective sensor, and a second arrangement for converting the set of digital values representing currently-sensed code values into a final binary output representative of an absolute position of the first member with respect to the second member.

Yet another form of the present invention involves the provision of an absolute Gray coded position encoder which includes: a first member having a plurality of sensor-detectable elements thereon, with the sensor-detectable elements positioned along a common track; and a second member movably mounted with respect to the first member to define N discrete relative positions of the first and second members. The second member has a set of sensors thereon for detecting the sensor-detectable elements. The sensors are spaced apart from one another, and positioned in alignment with the track such that the sensor-detectable elements pass adjacent to the sensors. Each sensor has an output that corresponds to a respective digit of a code word generated by the encoder. Adjacent values of the code word differ in one digit. Further, the value of the code word is unique for each of the N positions, and N is greater than four times the number of sensors in the set.

In accordance with another aspect of the present invention there is provided a method of manufacturing an absolute Gray coded position encoder that has n sensors, with each sensor having k states so that an output code of the encoder is of order k. The method comprising the steps of: (a) generating all n-digit, k-order necklaces that do not have a sub-period; (b) ordering a plurality of the necklaces generated in step (a) to obtain an ordered set of necklaces such that a Gray code condition is met between adjacent necklaces of the ordered set; (c) encoding a track of the encoder using the ordered set of necklaces generated in step (b); and (d) providing n sensors along the track, each sensor detecting one respective digit of the output code.

One principal feature of the invention involves providing a direct accurate digital output. Another unique feature is the ability to encode the information on a single track, thus reducing the size of an embodiment utilizing the inventive approach. A physical implementation of the present invention, as a general purpose input device, is seen as a replacement for potentiometers in consumer electronic devices (for example to control volume, tone, station select, balance, etc). Another set of applications is in position to digital output conversion, such as is utilized in shaft or linear encoders. In accordance with the inventive principle, these devices yield absolute digital information at low cost and low power consumption. The physical embodiment of the invention can have sensors which sense with mechanical contacts, optical techniques, magnetic techniques or capacitive techniques.

BRIEF DESCRIPTION OF THE DRAWINGS

Several preferred embodiments of the invention are described in detail hereinafter with reference to the accompanying drawings, in which:

FIG. 2a is a state diagram explaining the operation of a 24-step encoder;

FIG. 2b lists a code sequence of 24 unique states corresponding to the state diagram of FIG. 2a;

FIG. 11a is a chart illustrating six 5-bit necklaces, with necklace rankings shown to the left of each respective necklace;

FIG. 11b is a graph showing how the necklaces of FIG. 11a are interconnected in order to generate a Gray code sequence, and further showing a closed-loop path (shown in darkened lines) derived in accordance with the present invention;

FIG. 11c is a chart illustrating the necklaces of FIG. 11a, rearranged according to the closed-loop path of FIG. 11b;

FIG. 13 illustrates the packaging for an encoder in accordance with the present invention.

DESCRIPTION OF THE PREFERRED EMBODIMENTS

Figure 1:
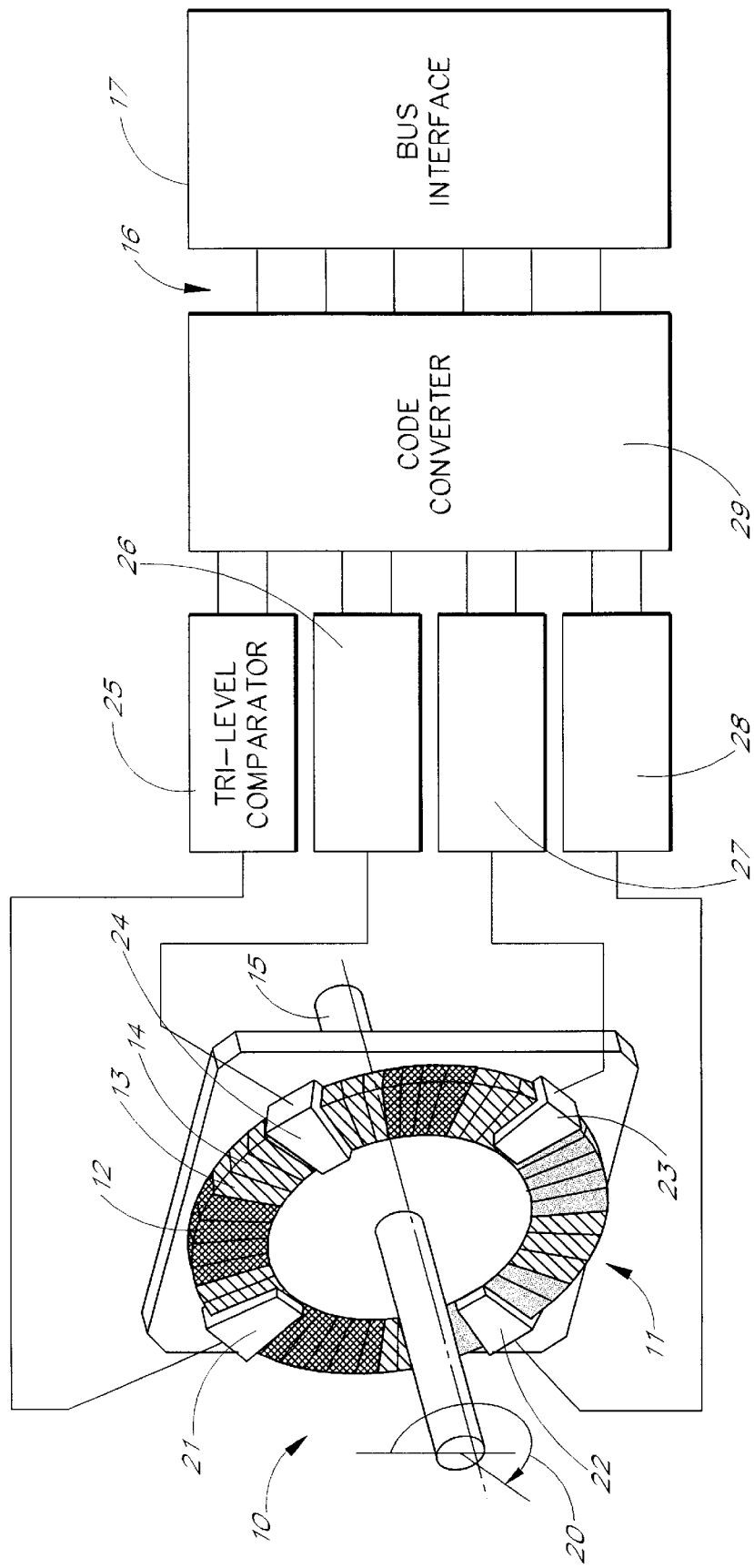
FIG. 1 is a diagrammatic perspective view of an absolute 48-step position encoder embodying the present invention, and shows various functional blocks of the system.

An absolute digital position encoder embodying the invention is shown in FIG. 1. A disc 10 features a circular track 11 which has been subdivided into several sectors 12, 13, 14, and the disk 10 is mounted on a rotatably supported shaft 15. The angular position 20 of the disc is the physical input variable to be converted to an electronic digital output 16. Four stationary sensors 21 to 24 are placed at equal angular intervals to detect a code pattern on the annular track 11. The signals output by the sensors 21 to 24 are fed to a bank of comparators 25 to 28, which in turn feed a code converter 29. The final output 16 of the code converter is an absolute binary code corresponding to the angular position 20 of the disc 10 in a discrete proportional fashion. A bus interface 17 allows this absolute binary code to be read by a microprocessor (not shown) over a multi-device bus.

To understand the operation of the encoder, we need to look at the underlying coding principle. Conventional encoders utilize a binary scheme, which allows a maximum of $2^n$ combinations, where n is the number of sensors. Unfortunately, in a binary encoder a large number of sensors also means a large number of tracks.

According to the invention, a scheme employing a ternary code first of all yields a larger number of unique combinations, namely $3^n$. A more interesting feature of the ternary code is the fact that cyclic codes are possible which create a unique set of combinations of words of length n, by using n sensors to sense the ternary values at n equal intervals along a track. This feature is the basis for a single track encoder scheme according to the invention.

Even though a ternary code has advantages, in some cases it is more efficient to utilize a binary or a quaternary (two binary bits) coding scheme. This occurs whenever one wants to make use of existing integrated circuitry or when the number of positions per full circle is by nature a power of two (for example a 256 position encoder).

Let us now look closer at the concept of a ternary sequence by first establishing a set of three rules:

1) A ternary digit can assume three states: 0, 1 and 2, where 0 is between 1 and 2.
2) Each ternary code word (n digits) must be unique in a code sequence (no repeats).
3) Transitions can only occur between 1 and 0 or between 2 and 0. Direct transitions between 1 and 2 are illegal, because 0 is between 1 and 2 (Rule 1) and thus, in practice, such a transition would inevitably still go through 0, and therefore produce an undesirable glitch.

Figures 2A, 2B:
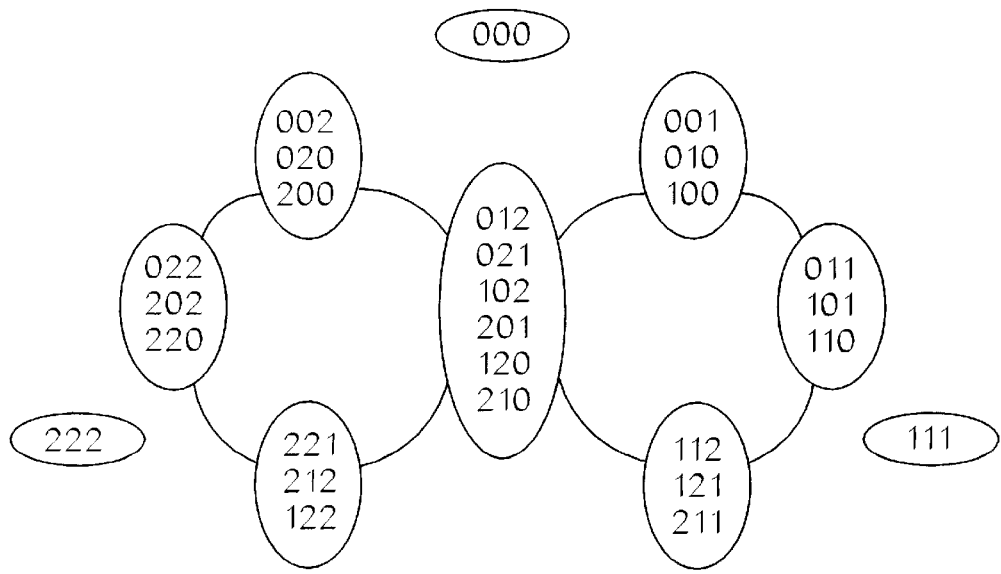
Figure 5:
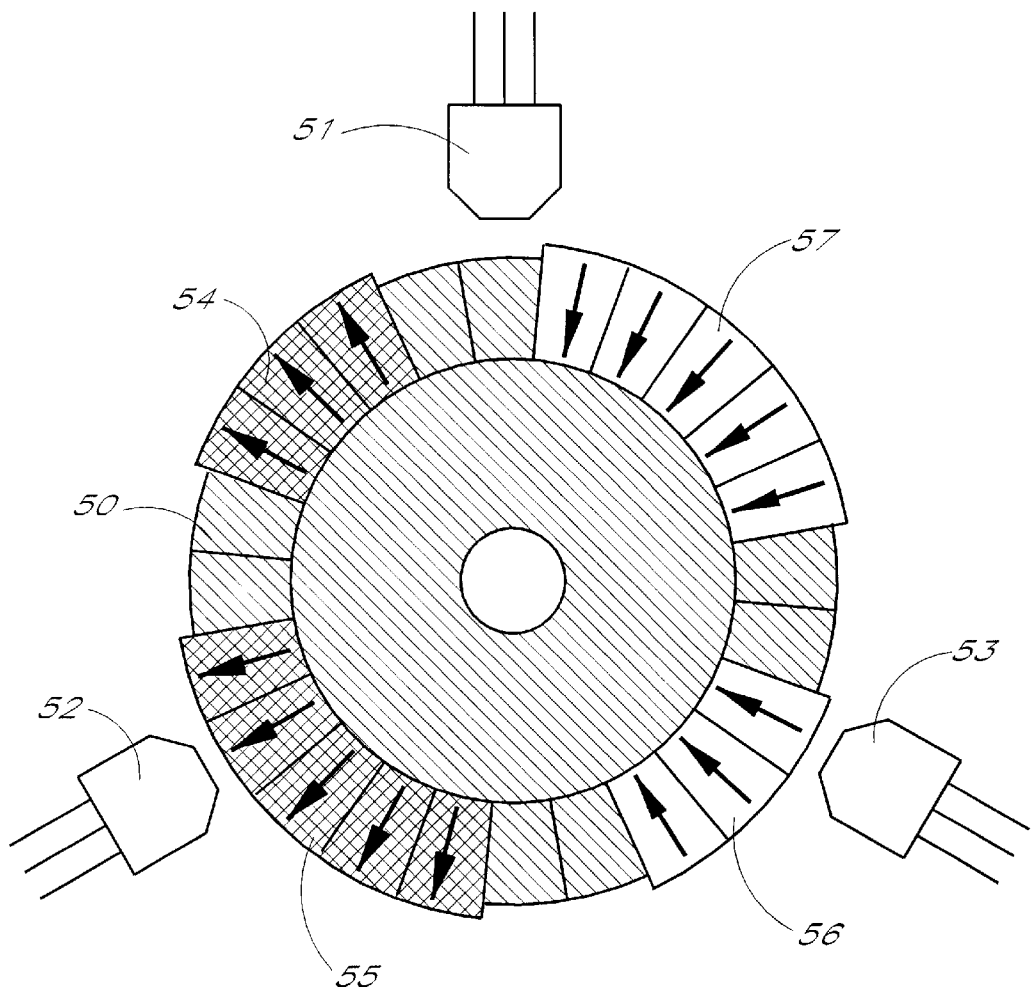
FIG. 5 is a diagrammatic illustration of a further encoder embodying the present invention, which is a low resolution encoder based on a magnetic principle utilizing a selectively magnetized rotor plus three Hall sensors as detectors.

A lattice chart shown in FIG. 2a is useful to illustrate the different possible states and to find a connecting path of the desired length. For simplicity we look at a code with just three ternary digits, resulting in 27 possible states. The chart groups triplets according to their number of zeroes, ones and twos. A number of interesting observations can be made:

1) The states with three identical digits are forbidden codes, since they would repeat themselves three times where the sensors are equally spaced.
2) According to above Rule 3, the path connecting the various triplets can never move horizontally. Instead, the legal moves are always diagonal by either exchanging a 1 or a 2 for a 0, or vice versa.
3) A unique sequence of 24 steps is possible according to this state diagram. The triplets of this sequence are listed explicitly in FIG. 2b. This code is utilized in the magnetic implementation of the encoder which is illustrated in FIG. 5 and described in more detail below.
4) The second and third rows of FIG. 2b are cyclic shifts of the first row. Each shift is one third of the full code length, and reflects the fact that the sensors are equally spaced along the track.

Figure 2C:
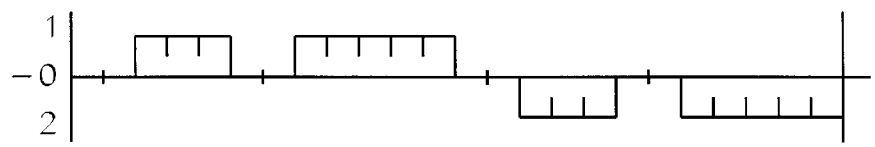
FIG. 2c is a timing diagram showing amplitude vs. time for one digit of the code sequence of FIG. 2b.

FIG. 2c illustrates the output of one sensor over a period of a 360° rotation of the associated disk. This pattern is obtained when executing three passes along a "figure eight" shaped path in FIG. 2a. The pattern is the same as the first row of FIG. 2b, 1 indicating a positive signal, 2 a negative one. In this code, the second half is the complement of the first half.

Figure 2D:
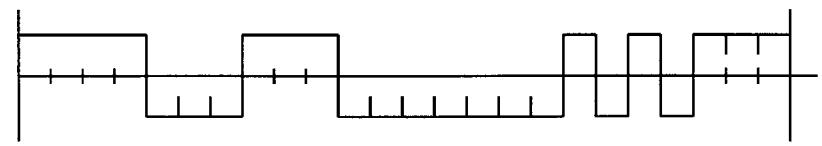
FIG. 2d is a timing diagram showing amplitude vs. time for one digit of another 24 step code sequence according to the invention, which features balanced odd/even transitions.
Figure 2E:
FIG. 2e is a diagrammatic representation of the aperture of a sliding sensor.
Figure 2F:
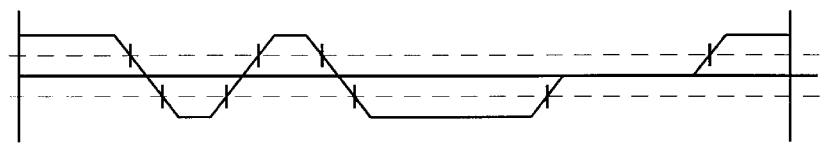
FIG. 2f is a timing diagram showing the result of convolving the digit code sequence of FIG. 2d with the moving sensor aperture of FIG. 2e.
Figure 2G:
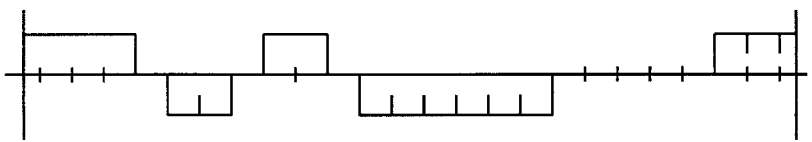
FIG. 2g is a timing diagram showing the final 24 step code for the digit after tri-level discrimination.

Since any practical sensor has a finite size or aperture, the code pattern will necessarily be convolved with the sensor aperture. This results in smoother transitions, limiting the accuracy of the method. If an improved code is used, this effect can be drastically reduced. Such a code is shown in FIG. 2d. Note that the pattern on the code wheel now consists of only two states. FIG. 2f shows the signal obtained when the code pattern is sampled with a detector which has a two step wide aperture as shown in FIG. 2e. Now we can again distinguish three levels and detect 24 unique positions, as shown in FIG. 2g.

An important feature of the inventive single track encoder principle is the newly gained ability to make a low cost encoder module of small size.

Since the inventive encoder yields an absolute reading, it is possible to run it in a strobed fashion without loss of data. A state-of-the-art incremental encoder, on the other hand, must have its sensors active continuously. Where power consumption is a critical issue, strobed operation can reduce the average current to only a few microamperes, even when LEDs or Hall sensors are used, because they can run at a duty cycle of less than 1:1000.

In order to illustrate some different applications, several embodiments of the inventive principle are described below.

Figure 3:
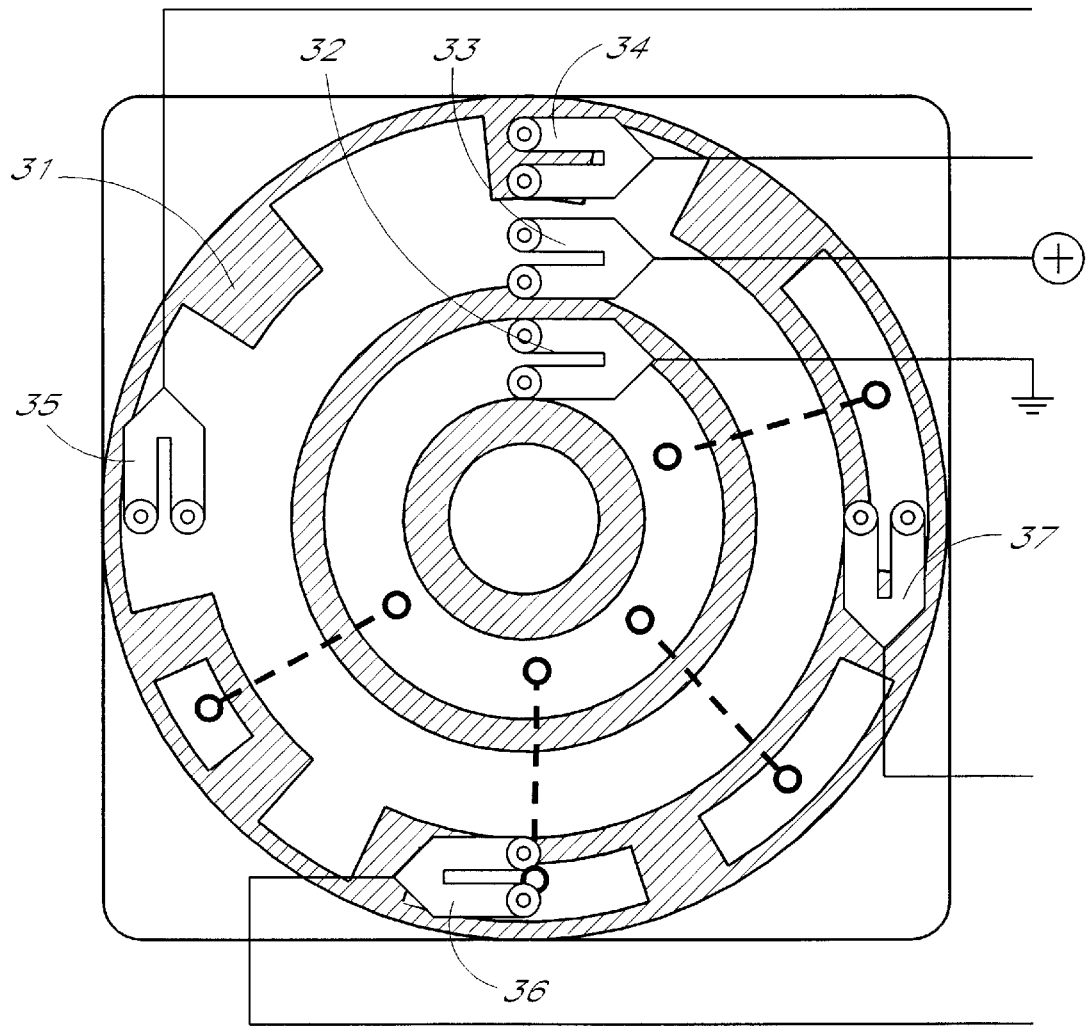
FIG. 3 is a diagrammatic view of another encoder according to the invention, which utilizes a set of sliding contacts.

In a 64 position setup using mechanical contacts, which is shown in FIG. 3, the encoder has a set of sliding contacts 34, 35, 36 and 37 distributed along a single track 31. The different portions of the track 31 are either grounded via a sliding contact 32, connected to the supply voltage via a sliding contact 33, or left open.

Figure 4:
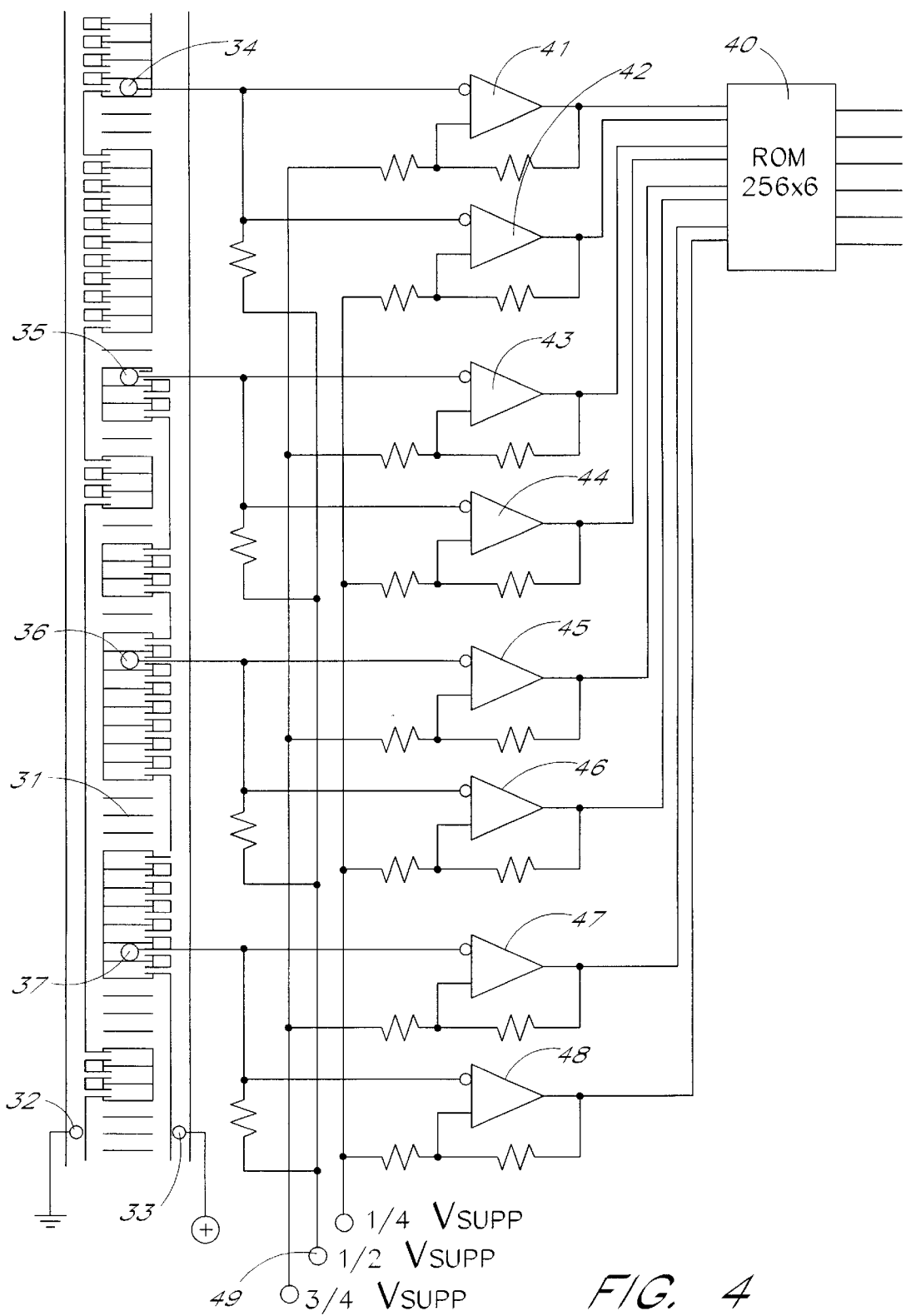
FIG. 4 is a diagrammatic illustration of an electronic comparator and code converter circuitry utilized to generate absolute binary output data from a sliding contact encoder of FIG. 3.

On the sensing side (FIG. 4) we find a bank of comparators 41 to 48. Note that each of the four input lines from the respective sliding contacts 34–37 is resistively tied to a mid-point bias (½ VSUPPLY) 49, so that an open input appears at half the supply voltage. Each channel is equipped with a pair of comparators defining three bands: (1) below one quarter of the supply voltage, (2) one quarter to three quarters of the supply voltage, and (3) above three quarters of the supply voltage, which respectively correspond to the ternary states 2, 0 and 1. A ROM table 40 (256×6), or an equivalent network of AND and OR gates, is then used to convert from the four pairs of lines representing a ternary code word to a conventional binary output format. In the case of the ROM table 40, each address corresponds to a respective ternary code word of the code sequence, and the data in that location is a corresponding binary output value, successive code words of the sequence producing progressively increasing binary values.

MAGNETIC

A first type of non-contacting scheme (FIG. 5) utilizes a magnetized disc 50 and a set of linear Hall sensors 51, 52 and 53 (part #3503 from Allegro Microsystems of Worcester, Mass.). The disk features 24 segments of positive 54 and 55, zero, and negative 56 and 57 flux regions, arranged according to the pattern shown in FIGS. 2 and 5. The zeroes are each two steps wide, and the segments of positive and negative flux are each three or five steps wide.

On the stator part of the encoder, the three Hall sensors 51, 52 and 53 have been mounted in a way to ensure a minimal air gap between each sensor and the magnetic disc 50. A fourth identical sensor (not illustrated) is located outside the magnetic field, and is used as a reference element to compensate for the inherent temperature drift of the sensors. The linear Hall sensors produce a direction sensitive, flux proportional output. The difference between each sensor output signal and the reference element output signal is amplified, producing three channels. These three channels then become inputs to three pairs of comparators, arranged similar to the comparators shown in the circuit of FIG. 4. The ternary output signals of each of the three differential comparators are also similar to the ones found in FIG. 4, as is the table that converts from the comparator states to the final binary position output.

OPTICAL

Figure 6:
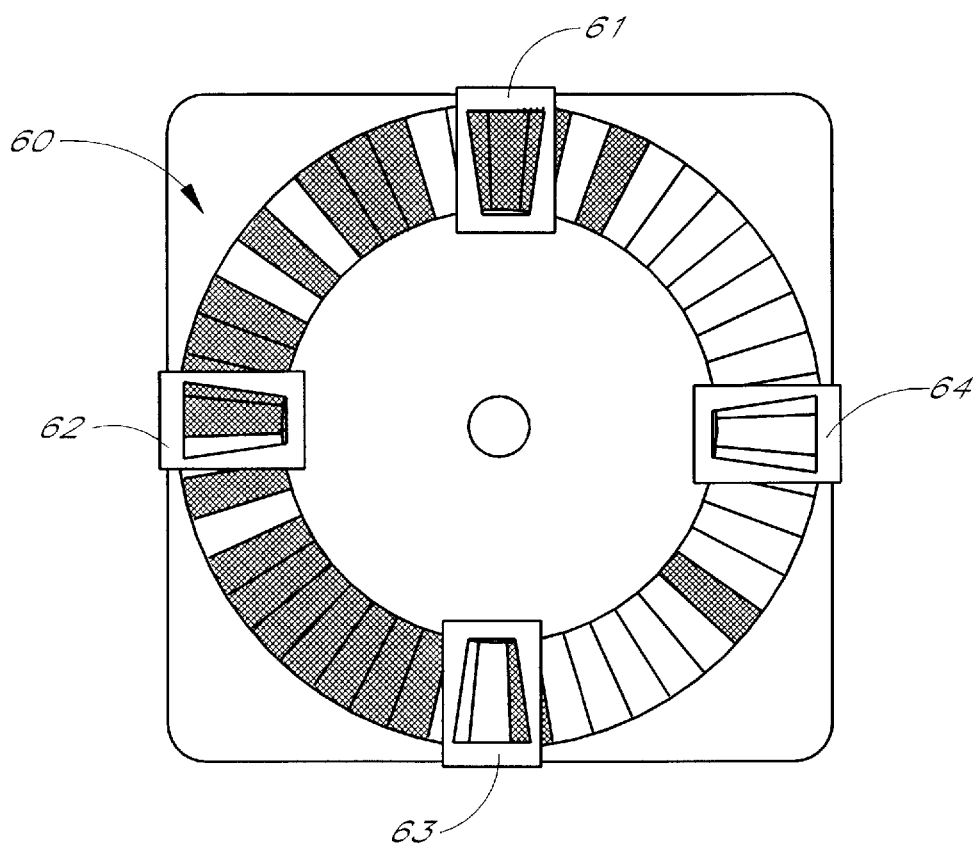
FIG. 6 is an illustration of another encoder embodying the invention, which is based on an optical principle utilizing LED/photo-transistor pairs as detectors and a patterned interrupter wheel as a rotor.

Another non-contacting embodiment involves an optical encoder. Either transmissive or reflective arrangements are possible. FIG. 6 illustrates a 48 increment transmissive set-up. The single track disc 60 is segmented into areas that are transparent or opaque to the near-infrared light used by the photo interrupters. The sensing area of each detector 61 to 64 is a segment two steps wide. Therefore the presence of an opaque and a transparent field within the sensitive area yields the third, semi-opaque state. The utilized code must be of the balanced kind, such as illustrated in FIG. 2d. The detection scheme again is based on two interval comparators per channel, similar to those used in the aforementioned arrangement of FIG. 4.

In yet another optical embodiment, the code pattern could be printed on the edge of paper to be used in a printer, similar to a long bar code arrangement. Reflective sensors can then be used to sense the exact feed amount and line location of the paper.

CAPACITIVE

If a cost effective and low-power encoder is desired, a capacitive scheme has some very attractive features. Its sensors are the plates of a capacitor. In the simplest embodiment, such a set of plates can be formed as lands on two pieces of printed circuit board placed in close proximity to each other. An AC signal applied to one of the plates is capacitively coupled to the opposing plate. The signal needs to be amplified by a device with a very high input impedance, typically an operational amplifier with an FET input. The amplitude of the signal is a function of the amount of overlap between the two plates. For a ternary encoder three states are distinguishable:

a) a signal which is above a threshold (for example 50% of the amplitude at maximum coupling) and which exhibits the same phase as the reference oscillator is treated as a ternary 1.
b) a signal which is above the threshold and 180° out of phase with regard to the reference oscillator is treated as a ternary 2.
c) a signal below the 50% threshold is treated as a ternary 0.

Figure 7:
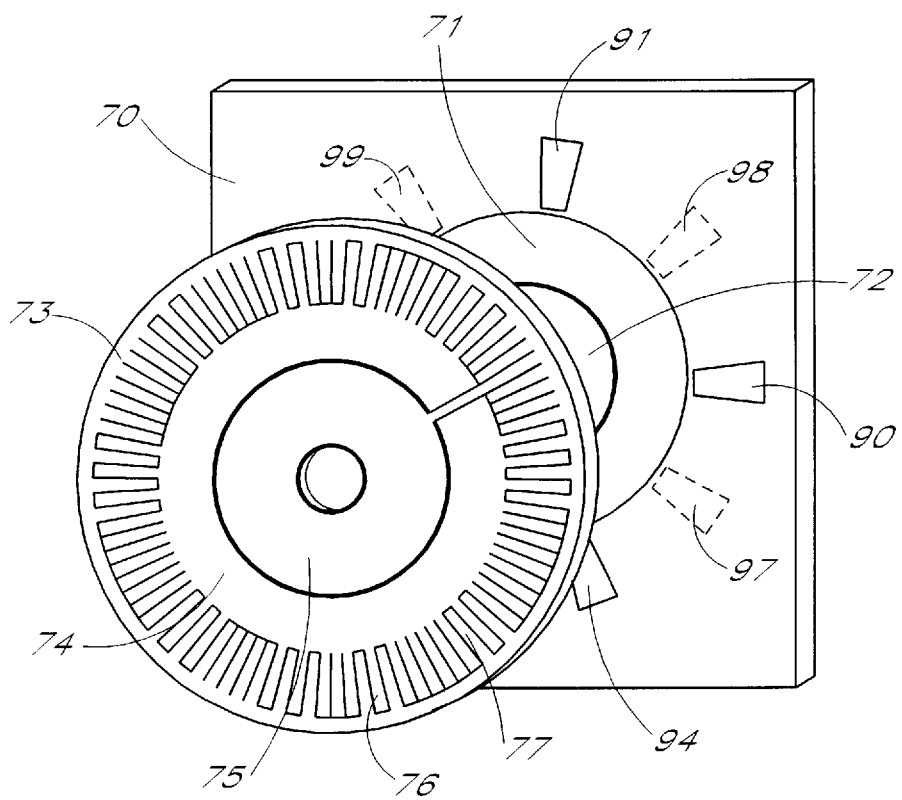
FIG. 7 is a diagrammatic view of still another encoder embodying the invention, which is based on a capacitive principle utilizing sector shaped electrodes as sensors and AC excitation.

FIG. 7 illustrates the arrangement of a 100 increment capacitive encoder. A single sided arrangement is shown, but a rotor sandwiched between two stators is also possible. The stator 70 has two concentric electrodes 71 and 72 of equal surface area, one of which is driven by the direct output of an exciter 81 (FIG. 8), and the other of which is driven with a complementary signal. The drive signal is typically a square wave of a few kilohertz. The rotor disc 73 has two ring-shaped electrodes 74 and 75 facing the stator electrodes 71 and 72, and capacitively picking up the signals which they carry. The rotor further carries a plurality of circumferentially offset segments 76 and 77 which are each electrically connected either to the outer ring electrode 74 or to the inner ring electrode 75. These segments thus each carry an essentially square-wave signal either in phase or out of phase with regard to the exciter 81.

The stator 70 further features five segments 90 to 94 that are two increments wide and are spaced at equal intervals around the circumference in the same band and opposing the code pattern on the disc. These segments capacitively pick up the signal from either the in-phase or the out-of-phase excitation signal. Where two adjacent rotor fields of opposite phase both face a pickup electrode, the coupled signals cancel, thereby yielding the third or "zero" state.

Figure 8:
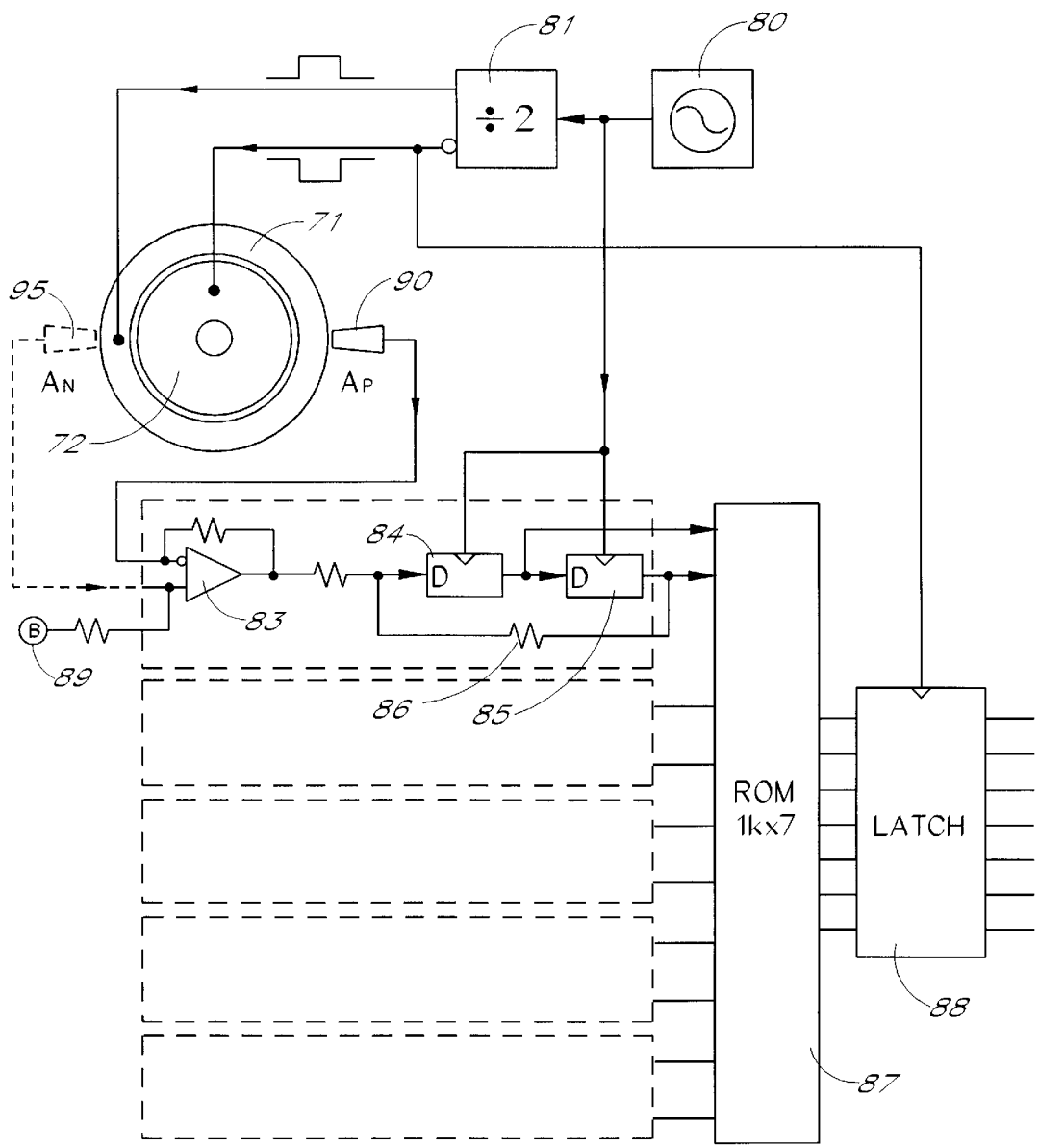
FIG. 8 is a diagrammatic view of the electronic excitation circuitry, amplification circuitry, and synchronous detection circuitry utilized to distinguish the three levels in a capacitive encoding scheme.

FIG. 8 shows the circuitry connected to the capacitive encoder. An oscillator 80 followed by a frequency dividing exciter 81 generates the two phase signals connected to the concentric electrodes 71 and 72 of stator 70. Since the detection circuitry is identical for each of the five channels, only one is shown. In particular, a high-impedance operational amplifier 83 amplifies the signal from the electrode 90. Typically this is a low power, slew rate limited device, which shapes the original square wave signal into a rounded triangular wave. Two cascaded D-type flip-flops 84 and 85 act as synchronous detectors, the output of the amplifier 83 being connected through a resistor to the data input of flip flop 84, and the data output of flip flop 84 being connected to the data input of flip flop 85.

The input amplifier 83 is biased to a set point 89 so as to have the positive peaks of the amplified electrode output signal be clearly above the threshold input level of the flip-flop 84, which is typically 50% of the supply voltage. A slight amount of positive feedback 86 has been added to provide Schmitt trigger action for clean transitions between states. The outputs of the detector circuits for the respective channels are connected to address inputs of a 1k×7 ROM 87, which converts the 5 input line pairs to a 7 bit binary output code that is sampled by a latch 88. The ROM 87 is functionally equivalent to the ROM 40 of FIG. 4.

The flip flops are clocked simultaneously by the oscillator 80 in a way so as to sample either the positive or the negative peak of the amplified electrode signal. The binary output of the ROM 87 is latched into the latch 88 once per period of the square wave applied to the electrodes. At this instant an amplified input electrode signal which is in phase with the master oscillator will have set the first flip flop 84, whereas a signal out of phase will have set the second flip flop 85. In the "zero" case, the amplified electrode signal is too small to set either. The flip flops 84 and 85 are clocked twice as fast as the latch 88. Thus, after the latch is loaded, the flip flop 84 is loaded, and then its contents are transferred to the flip flop 85 as the flip flop 84 is loaded again, after which the latch is loaded again. If the disk is not being rotated, the flip flops 84 and 85 will both contain the same logic value when the latch is loaded. On the other hand, if the disk is being rotated, the flip flops may contain the same value or may contain different values when the latch is loaded.

In certain cases the code pattern can be symmetrical. For example, the second fifty steps of the above one hundred step pattern have the exact opposite polarity as compared to the first fifty (see also FIG. 2c). Such a code allows the use of differential detectors placed 180° out of phase. The dashed segments 95 to 99 in FIG. 7 and the dashed input lines in FIG. 8 illustrate the differential configuration. In a high impedance capacitive set-up, a differential scheme has the advantage of substantially increased noise immunity.

A ternary coding scheme reduces the number of required sensors, and is particularly appropriate for values that naturally feature three states, such as the contacting, magnetic and capacitive examples given above. Under certain circumstances it is, however, more advantageous to utilize a binary code:

a) When three levels are hard to define in real-life conditions. The output amplitude of an LED/phototransistor pair is subject to major variation, and establishing a 50% value requires extra adjustment.

b) When the encoder is directly interfaced to an off-the-shelf electronic component (ROM or driver). Since standard digital circuitry operates on binary logic, choosing a binary coding scheme makes sense in such cases.

The binary code must again feature only a one digit (i.e., one bit) change per transition, as set forth above for the ternary code and illustrated in FIG. 2b.

Figure 9:
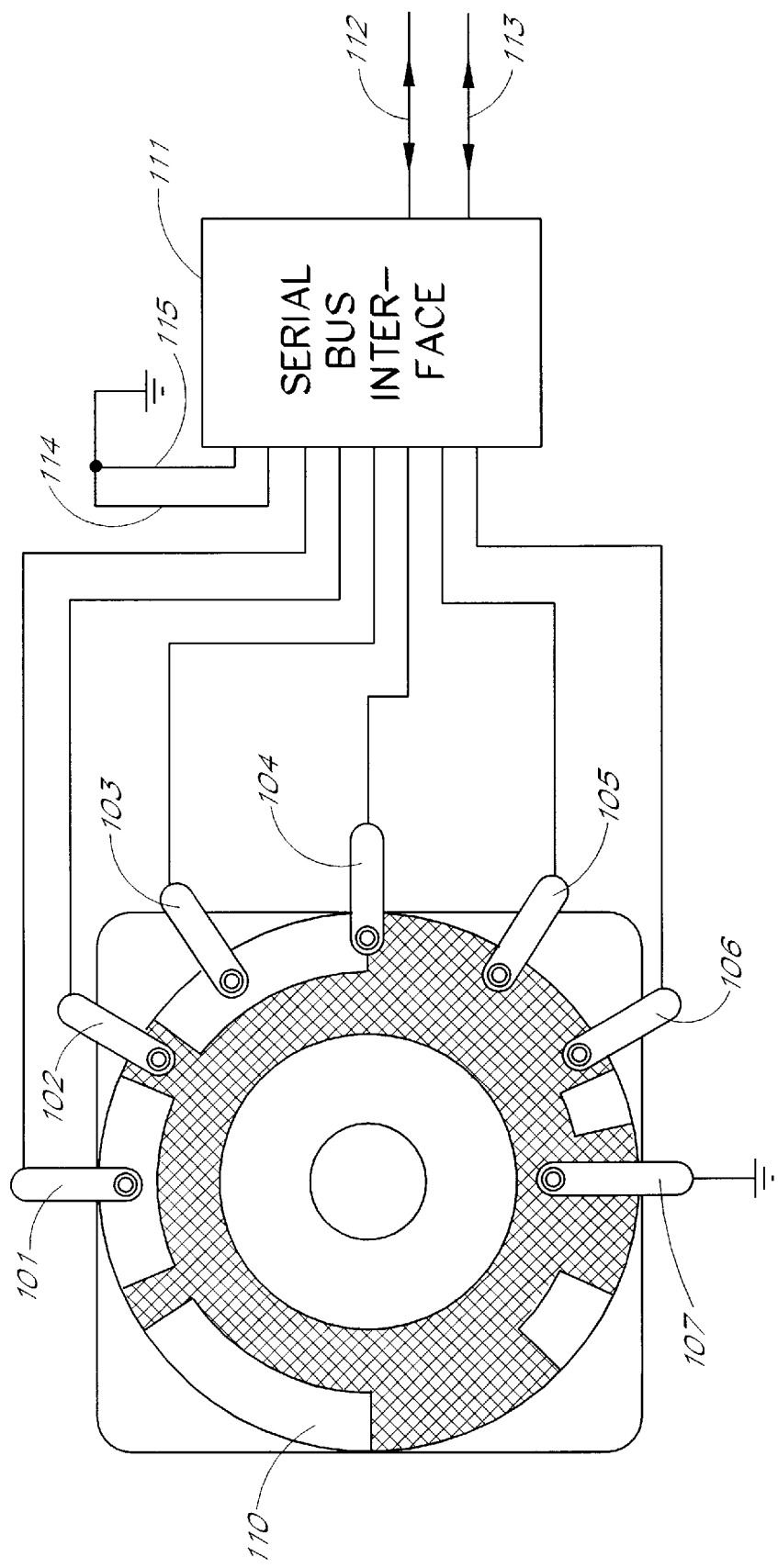
FIG. 9 is a diagrammatic view of still another embodiment of the invention, which is based on a binary coding scheme featuring 60 unique positional readings and a contacting detection arrangement.

FIG. 9 illustrates a case where an 8-bit bus driver integrated circuit is used to provide a serial output from the encoder, thus utilizing a two wire interface. Such a bus interface can be implemented with a commercially available part (for example a PCF 8574 made by Philips of Eindhoven, the Netherlands). Six pickup contacts 101 through 106 are arranged at angular spacings of 30° about a coding wheel 110, which has conductive and nonconductive regions on its surface. A seventh contact 107 provides a ground reference to the coding wheel 110. The coding wheel 110 is patterned for sixty positions in a manner similar to the previous examples, except that now we distinguish only two states. These are "grounded" or "open". An open contact will result in a high level signal due to the internal pull-up resistors of the interface circuit 111. An encoder built in this fashion can be tied to a serial bus, where a number of devices can be connected to the same two wire line (112 is the serial data, and 113 the serial clock). The two highest bits 114, 115 of the interface circuit are grounded.

The binary, ternary and quaternary encoders described herein (quaternary encoder described below with reference to FIG. 10) are specific examples of single track encoders in that are designed in accordance with the design principles of the present invention. The first step is designing an encoder of the type described is to generate an appropriate sequence of output codes. As indicated above, this sequence preferably has the following characteristics:

1. The sequence is a Gray code sequence, meaning that adjacent output codes differ in only one digit.
2. Every output code of the sequence is unique.

The method for generating such a code sequence will now be described. Referring again to FIG. 2a, all possible permutations of a three bit ternary output code are shown. Codes that are cyclic shifts or rotations of the same three-bit string, or "necklace" are grouped together within a bubble. The codes 022, 202, and 220 are grouped together, for example, since all three codes are cyclic shifts of the necklace "220." Each bubble in FIG. 2a represents a necklace, with the central bubble representing two necklaces. The necklace for the group 022, 202, and 220 is represented by the code "220," since 220 is the largest three-digit value of 022, 202, and 220. The necklaces 000, 111 and 222 do not change when their respective elements are shifted, and thus are not candidates for the output sequence. These three codes are thus discarded. (More generally for an n-digit code, any code value that repeats itself when rotated fewer than n positions must be discarded, as further described below.) The remaining 24 code values, when properly arranged (as in FIG. 2b), will have the desired Gray code and uniqueness characteristics described above. For the case shown in FIGS. 2a–c, the code sequence can be found by trial and error, since the total number of output codes is relatively small. For longer sequences, a more efficient approach is required.

A general procedure for generating a code sequence for a single track encoder will now be described. For purposes of this description, the variable "n" represents the number of sensors, and the variable "k" represents the order of the code (i.e., 2 for binary, 3 for ternary, 4 for quaternary, etc.). The procedure generates cyclic Gray code sequences (i.e., sequences for which the Gray code condition is met for all transitions, including the transition between the last output code and the first output code). The length or "period" of a code sequence generated using the procedure will always be an even multiple of n. For a 6 bit encoder, for example, the procedure can be used to generate a 6-digit Gray code sequence that has a length that is an even multiple of six (e.g., 18, 24, 30, . . . ). Of course, the length of the sequence cannot exceed the theoretical maximum of $k^n$ without one or more codes repeating. In many cases, however, the highest even multiple of n that is less than $k^n$ can be reached. For a 6 sensor binary encoder, for example, a Gray code sequence of length 60 (the highest even multiple of 6 that is less than $2^6=64$) can be generated, as described below. A highly efficient single track encoder can thus be obtained.

A relatively simple 5-bit binary example will be used to illustrate the procedure. The steps of the procedure are as follows.

Step 1: Establish the number of sensors n (e.g., 5) and the order of the code k (e.g., 2).

Step 2: Generate a list of the necklaces for an n-bit, k-order code, discarding any necklace that repeats itself when rotated fewer than n positions (or equivalently, discarding any code value that has a "sub-period"). Discarding such necklaces ensures that all output codes in the sequence will be unique. In certain situations, however, these discarded necklaces can later be "added in" to lengthen the code sequence.

The necklaces can be found algorithmically using routines that are well known in the art. One such routine is described in F. Ruskey et. al., "Generating Necklaces," *Journal of Algorithms*, vol. 13, 1992, pp. 414–430. In the present example, a total of six 5-bit necklaces are obtained. These six necklaces are illustrated in FIG. 11a, with each necklace shown as one row of 5 digits. Note that the necklaces 00000 and 11111 (not shown in FIG. 11a) must be discarded to ensure that all output codes will be unique. The highest possible code length will be 30, which is the highest even multiple of 5 that is less than $2^5=32$. However, code lengths of 10 and 20 are also possible.

Step 3: Assign a rank to each necklace. In FIG. 11a, the ranks (shown to the left the respective necklaces) have the form "A.B," where A represents the number of zeros in the necklace, and B is an index to distinguish necklaces that have the same number of zeros. The index 3.2, for example, indicates that the necklace has three zeros, and that it is the second necklace (from the top of the chart) that has three zeros.

Step 4: Make a graph of the necklaces, placing the necklaces at levels that correspond to the number of zeros they have. In FIG. 11b, for example, the necklace with one zero (1.1) is shown at the highest level, the necklace with four zeros (4.1) is shown at the lowest level, and necklaces having two zeros (2.2 and 2.2) and three zeros (3,1 and 3.2) are shown at respective intermediate levels.

Step 5: Connect the necklaces that differ in one digit (i.e., the necklaces that satisfy the Gray code condition), labeling each connection to indicate the number of positions a necklace must be rotated for the Gray code condition to be met. The connections are labeled by the following convention: (a) If the Gray code condition is satisfied for two necklaces without rotating either necklace, those two necklaces are connected by a plain line. Necklaces 1.1 and 2.1 in FIGS. 11a and 11b are an example of such a necklace pair, since the Gray code condition is met without rotating the necklaces from their respective positions of FIG. 11a. (b) If the target necklace must be rotated by x positions in order to satisfy the Gray code condition, the connection is labeled with x (referred to as the "offset"), with an arrow indicating the direction of travel between the two necklaces. In the example shown, note that an offset of +3 is equivalent to an offset of −2, since +3=−2 taken modulo 5. To keep the numbers small, the largest label we allow in the example is 2. Further, the arrows are placed such that all labels are positive.

Step 6: Find a closed-loop path in the graph that (a) connects the desired number of necklaces, and (b) yields a net offset of ±1 (taken modulo n) when all offsets along the closed path are summed. A net offset of ±1 ensures that, after one pass through the loop, each code will be rotated by one position. An example of a path that meets the above criteria is shown in FIG. 11b in dark lines. Note that since each code rotates by one position with each pass through the loop, the code begins to repeat itself after 5 loops. Note also that it is possible to find a loop that meets the above criteria, but which does not connect every necklace. In FIG. 11b, for example, loops can be found that connect only two necklaces and only four necklaces, resulting in code sequences of length 10 and 20, respectively.

Step 7: Rearrange the necklaces according to the path found in step 6. The rearranged necklaces for the path shown in FIG. 11b are shown in FIG. 11c.

Step 8: Read the list of necklaces generated in step 7 column-by-column (starting from the top left corner) to obtain the pattern for encoding the track of the encoder. For the block shown in FIG. 11c, for example, the single track of the encoder would be encoded with the pattern 111111111000110011100000000001. Assuming the encoder is implemented as a rotary encoder, the sensors would be equally spaced from one another over a 360 degree range.

The output sequence for the encoder corresponding to FIG. 11c is given in Table 1. Note that the output codes for adjacent blocks of six positions are the same, except that the rows are rotated by one position. The output codes for positions 7–12, for example, are obtained by rotating the output codes for positions 1–6 by one position. Note further that all adjacent codes (including positions 30 and 1) differ by only one bit, and that the output sequence is thus cyclic.

TABLE 1

| Position | Output Code |
|---|---|
| 1 | 11110 |
| 2 | 11100 |
| 3 | 11000 |
| 4 | 10000 |
| 5 | 10100 |
| 6 | 10101 |
| 7 | 11101 |
| 8 | 11001 |
| 9 | 10001 |
| 10 | 00001 |
| 11 | 01001 |
| 12 | 01011 |
| 13 | 11011 |
| 14 | 10011 |
| 15 | 00011 |

TABLE 1-continued

| Position | Output Code |
|---|---|
| 16 | 00010 |
| 17 | 10010 |
| 18 | 10110 |
| 19 | 10111 |
| 20 | 00111 |
| 21 | 00110 |
| 22 | 00100 |
| 23 | 00101 |
| 24 | 01101 |
| 25 | 01111 |
| 26 | 01110 |
| 27 | 01100 |
| 28 | 01000 |
| 29 | 01010 |
| 30 | 11010 |

The maximum period that can be obtained by the above-described procedure is equal to the number of necklaces obtained in step 2 times the number of sensors. For the 5-bit binary encoder described above, for example, the period is 5 (sensors)×6 (necklaces)=30 positions. Of course, the period will be smaller if any of the necklaces are not used.

Looking at the case where n=6, the maximum period is only 48. This is due to the fact that in step 2 we must discard not only the necklaces 000000 and 111111, but also the necklaces 101010, 110110 and 001001, since each of these necklaces has a sub-period. (The code 101010, for example repeats when rotated by either two or four positions, and thus has sub-periods of 2 and 4).

Figure 10:
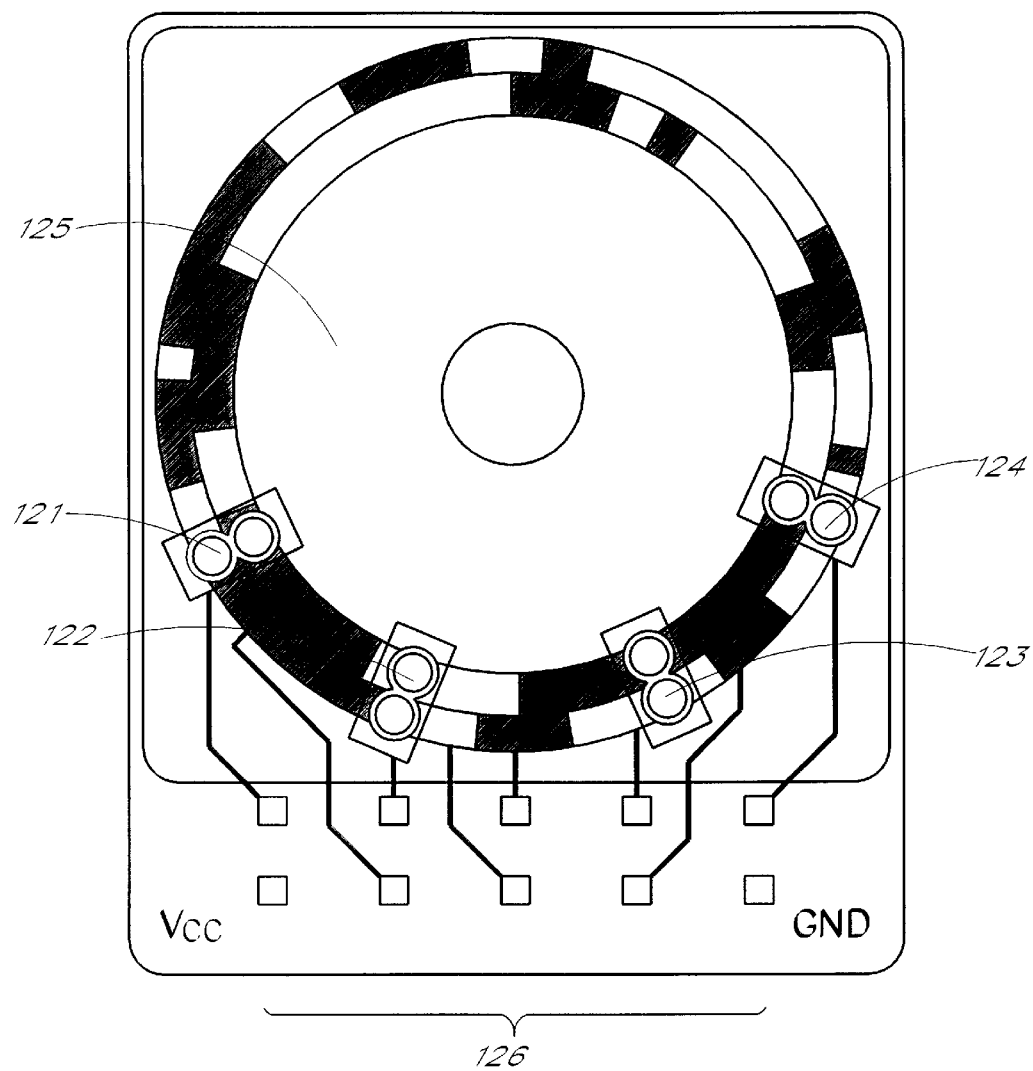
FIG. 10 is a diagrammatic view of still another embodiment of the invention, based on a quaternary coding scheme featuring 256 unique positional readings and optical detection arrangement.
Figures 12A, 12B, 12C:
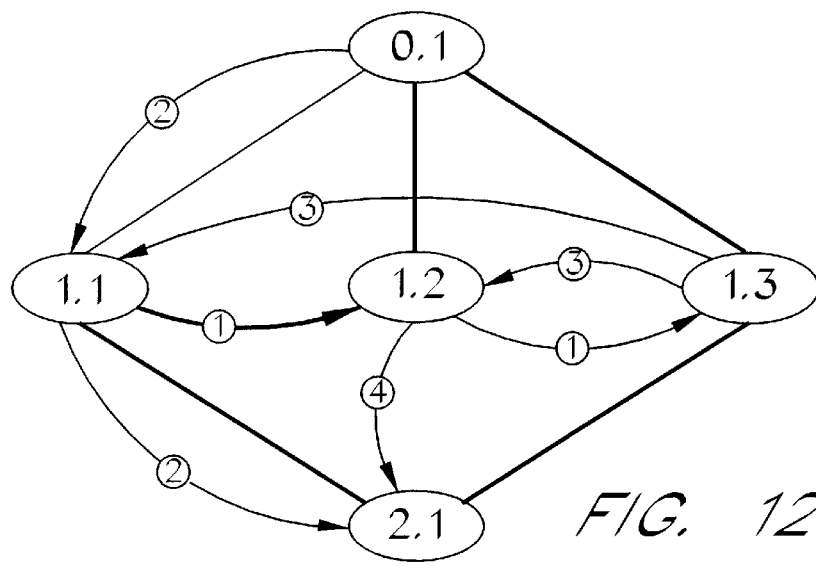
FIG. 12a is a chart illustrating five bi-necklaces, with necklace rankings shown to the left of each respective bi-necklace.
FIG. 12b is a graph showing how the necklaces of FIG. 12a are interconnected in order to generate a Gray code sequence, and further showing a closed-loop path (shown in darkened lines) derived in accordance with the present invention.
FIG. 12c is a chart illustrating the bi-necklaces of FIG. 11a, rearranged according to the closed-loop path of FIG. 12b.

A variation of the above-described procedure produces an extension of the maximum period in some cases. For n=6, for example, a period of 60 can be obtained. This alternative procedure utilizes a different arrangement of the sensors; Unlike the sensors of the encoders designed using steps 1–8 above, which are spaced at equal intervals over 360 degrees (as shown in FIGS. 1, 3, 5, 6 and 7), encoders in accordance with this revised procedure are spaced at equal intervals over 180 degrees (as shown in FIGS. 9 and 10). The procedure is illustrated in FIGS. 12a–c for the 6-sensor binary encoder of FIG. 9.

The alternative procedure makes use of "bi-necklaces" that are twice the length of ordinary necklaces. The bi-necklaces for the sixty position encoder of FIG. 9 are shown in FIG. 12a. Each bi-necklace has a first half, which is patterned similar to the standard necklace, and a second half, which is a complement of the first half. Only the bi-necklace 110011001100 (having a sub-period of four) must be discarded, since it is the only bi-necklace that has a sub-period.

The step-by-step procedure for generating a single track Gray code sequence with bi-necklaces is analogous to the above-described procedure that uses ordinary necklaces, and can be summarized by the following steps:

Step 1: Establish the number of sensors n (e.g., 6) and the order of the code k (e.g., 2).

Step 2: Generate a list of the bi-necklaces for an n-bit, k-order code, discarding any bi-necklace that repeats itself when rotated fewer than 2n positions.

Step 3: Assign a rank to each remaining necklace (i.e., the first half of each bi-necklace), with the first index of the rank indicating the number of zeros in the necklace and the second index distinguishing necklaces that have equal numbers of zeros.

Step 4: Make a graph of ranked necklaces, placing the necklaces at levels that correspond to the number of zeros indicated by the first index. Such a graph for the bi-necklaces of FIG. 12a is shown in FIG. 12b.

Step 5: Connect the necklaces that differ in one digit (i.e., the necklaces that satisfy the Gray code condition), labeling each connection to indicate the number of positions a necklace must be rotated for the Gray code condition to be met. Step 6: Find a closed-loop path that (a) connects the desired number of necklaces, and (b) yields a net offset of ±1 when all offsets along the closed-loop path are summed. One such path is shown in FIG. 12b.

Step 7: Rearrange the bi-necklaces according to the path found in Step 6. The rearranged bi-necklaces are shown in FIG. 12c.

Step 8: Read the list of bi-necklaces obtained from step 7 column-by-column to obtain the code pattern for the track. For the list of bi-necklaces in FIG. 12c, this pattern is 111111111100111111000111111111 0000000000011000000011100000000.

A comparison of this code pattern to that of FIG. 9 (with zeros corresponding to shaded portions of the track and ones corresponding to unshaded portions) reveals the direct correspondence between the chart of FIG. 12c and the encoder track in FIG. 9. The sensors 101–106 are shown in FIG. 12c in a position that corresponds to the rotational position of the encoder in FIG. 9. Note that the six sensors 101–106, now being spaced at intervals of 5, form a window that is six columns wide. The one-bit-per-transition rule must be taken over such a six-wide window. Thus, for example, when moving from bi-necklace 0.1 to bi-necklace 1.1, a single bit changes, since the group of six sensors sees only a half of the bi-necklace at any time. Finally, note that the counterclockwise rotation of the rotor in FIG. 9 would correspond to the downward movement of the six sensors 101–106 in FIG. 12c.

Upon a second look at FIG. 9, it should be noted that the entire pattern can be broken down into two complementary halves. This characteristic brings us back to FIG. 2c, which also exhibits this self-complementary feature. Indeed, the encoder of FIG. 5 could have its three sensors spaced at intervals of four.

As will be apparent to those skilled in the art, the above-described procedures using ordinary necklaces and bi-necklaces are also applicable to the design of ternary and quaternary encoders. The 8-bit, 256 position quaternary encoder of FIG. 10 (described below), for example, was generated using the bi-necklace procedure to sort a total of 16 4-bit quaternary bi-necklaces.

It will be recognized that the inventive procedures described above produce single-track (and reduced track) encoders that are significantly more efficient than prior art single track encoders. The present invention thus overcomes the efficiency limitations of the prior art, enabling the potential size advantages of single track (and reduced track) encoders to be realized. By way of example, a six sensor binary encoder in accordance with the present invention (FIG. 9) has 60 positions, in comparison with 4×6=24 positions for prior art single track encoders. Viewed differently, a prior art 60-position single track encoder would have at least 60/4=15 sensors and output lines, in comparison with the six sensors and output lines of the FIG. 9 encoder.

The efficiency differences are even more dramatic for encoders of higher resolution. This is due to the fact that as the number of sensors is increased, the resolution of preferred encoders in accordance with the present invention follows a power law (i.e., the resolution is approximately $k^n$), while the resolution of single track encoders according to the prior art increases linearly.

One reason for this significant increase in efficiency over the prior art is that the present invention allows every necklace, excluding necklaces with sub-periods, to be utilized in the output sequence. Prior art design methods effectively skip over a large number of the necklaces (including the "useful" necklaces that do have sub-periods), resulting in encoders that cannot make use of many of the necklaces in the output sequence.

Extending the number of contacts, binary encoders with higher resolutions are possible. With eight sliding contacts, the maximum number of positions that can be resolved is 240, as long as one wants to maintain the previously established requirement that only one state must change at a time.

Since many industrial controllers operate on an 8-bit basis, providing an encoder with a 256-position resolution is desirable. The arrangement shown in FIG. 10 illustrates such a device. The wheel 125 is transparent, except for opaque portions defining the code. Four pairs of phototransistors 121 through 124 are arranged along the circular track. Each pair is illuminated by a respective conventional and not-illustrated LED on the opposite side of the wheel. The code inscribed on the wheel 125 is a quaternary (four level) code. Each detector pair senses the following states: 0, 1, 3, 2 (binary 00, 01, 11, 10). The numbers are purposely listed in this sequence since, as in the ternary example, only certain transitions are legal. In the above list each number can connect only to its neighbor, and 0 connects to 2 and vice versa. This is essentially a Gray-code feature, which ensures glitchless transitions between states.

Adhering to this rule, a sequence with 256 positions can be realized, thus exploiting the highest resolution for an 8-bit system. The encoder is shown here with a parallel interface 126.

FIG. 13 illustrates typical packaging for encoders in accordance with the preferred embodiments. A housing 130, typically made from plastic, covers the coded track and the sensors of the encoder, preventing dust and other particles from interfering with the encoder's operation. Rigid connecting pins 132 protrude from the housing, allowing the encoder to be soldered, plugged in, or otherwise connected to supporting electronics. A knob 136 is optionally attached to the shaft 134, allowing manual adjustment of the encoder.

For the sake of illustration, the encoders shown here are all of moderate resolution. The described principle can be applied to devices with much finer resolution. The limits of resolution are governed by the same physical constraints as apply to conventional, parallel encoders.

Note that if power to any of the inventive encoders is turned off and then back on, the encoder will output accurate absolute position information based solely on the set of currently-sensed code values, without any need to move the encoder parts relative to each other.

Although several preferred embodiments have been shown and described in detail for illustrative purposes, it will be recognized that there are variations and modifications of these preferred embodiments, including the rearrangement of parts, which lie within the scope of the present invention.

The embodiments of the invention in which an exclusive property or privilege is claimed are defined as follows:

1. A method of manufacturing an absolute Gray coded position encoder that has n sensors, each sensor having k states so that an output code of the encoder is of order k, the method comprising the steps of:
   (a) generating all n-digit, k-order necklaces that do not have a sub-period;
   (b) ordering a plurality of the necklaces generated in step (a) to obtain an ordered set of necklaces such that a Gray code condition is met between adjacent necklaces of said ordered set;

(c) encoding a track of said encoder using said ordered set of necklaces generated in step (b); and (d) providing n sensors along said track, each sensor detecting one respective digit of the output code.

2. The method according to claim 1, wherein said ordered set of necklaces if formed such that (i) exactly one digit differs in adjacent necklaces of said ordered set, and (ii) exactly one digit differs between first and last necklaces of said ordered set.

3. The method according to claim 1, wherein step (b) comprises the sub-step of determining a number positions a first necklace must be rotated so that said first necklace differs in exactly one digit from a second necklace.

4. The method according to claim 1, wherein the ordered set generated in step (b) includes all of the n-digit, k-order necklaces.

5. The method according to claim 1, wherein n is greater than 5.

6. The method according to claim 1, wherein the track is generally circular, and step (d) comprises positioning the n sensors such that the sensors are equally spaced apart from one another over an angular range of 360 degrees.

7. A method of manufacturing an absolute Gray coded position encoder that has n sensors, each sensor having k states so that an output code of the encoder is of order k, the method comprising the steps of:

(a) identifying all n-digit, k-order bi-necklaces that do not repeat when rotated by less than 2n positions, each bi-necklace including, respectively, a necklace and a complement of the necklace;

(b) ordering a plurality of the bi-necklaces generated in step (a) to obtain an ordered set of bi-necklaces such that the respective necklaces of adjacent bi-necklaces of said plurality satisfy a Gray code condition;

(c) encoding a track of the encoder using said ordered set of bi-necklaces generated in step (b); and (d) providing n sensors along said track, each sensor detecting one respective digit of the output code.

8. The method according to claim 7, wherein the ordered set generated in step (b) includes all of the bi-necklaces identified in step (a).

9. The method according to claim 7, wherein n is greater than 5.

10. The method according to claim 7, wherein k=2.

11. The method according to claim 7, wherein said ordered set of bi-necklaces is formed such that exactly one digit differs between the respective necklaces of the first and last bi-necklaces of said ordered set.

12. The method according to claim 7, wherein the track is generally circular, and step (d) comprises positioning the n sensors along the track over an angular range of no more that 180 degrees.

13. A quaternary, Gray-coded, absolute digital position encoder, comprising:

a first member having first and second circular tracks thereon, said first and second tracks positioned in concentric relation to one another, said first track having a first binary code formed thereon and said second track having a second binary code formed thereon, said first and second binary codes forming a quaternary code, and said first and second tracks forming a quaternary track; and a second member movably mounted with respect to said first member, said second member having a plurality of quaternary sensors which sense said quaternary code, each quaternary sensor comprising, respectively, a first binary sensor which senses said first binary code and a second binary sensor which senses said second binary code, said first and second binary sensors being angularly aligned with one another, each quaternary sensor generating a respective quaternary digit of a code word;

wherein said quaternary sensors are positioned relative to said first and second tracks such that individual values of the code word correspond uniquely to respective relative positions of said first and second members, and such that only one quaternary digit of the code word can change at-a-time during relative movement of said first and second members.

14. The digital position encoder according to claim 13, wherein the number of said quaternary sensors is 4, and the number of unique values of the code word is 256.

15. The digital position encoder according to claim 13, wherein each quaternary sensor generates, respectively, two bits of the code word, and wherein said quaternary sensors are positioned relative to said first and second tracks such that only one bit of the code word can change at-a-time during relative movement of said first and second members.

16. The digital position encoder according to claim 13, wherein the quaternary sensors are spaced apart at equal angular intervals along said quaternary track.

17. The digital position encoder according to claim 13, wherein each quaternary sensor comprises a pair of angularly-aligned LEDs that are illuminated by a respective LED.

18. The digital position encoder according to claim 13, wherein each quaternary sensor comprises a pair of angularly-aligned binary light sensors that are illuminated by a respective light source.

19. A ternary, absolute digital position encoder, comprising:

a first member having thereon a single circular track with a plurality of ternary code elements extending therealong to form a ternary code; and a second member supported for relative movement with respect to the first member, the second member having thereon a plurality of ternary sensors which are positioned adjacent to the track and configured to read the ternary code, each of the ternary sensors corresponding to a respective ternary digit of a code word;

wherein the ternary code and the sensors are arranged such that each value of the code word corresponds uniquely to a relative position of the first and second members.

20. The ternary position encoder according to claim 19, wherein the ternary code and the sensors are arranged such that the code word follows a Gray code sequence when the first and second members are moved relative to each other.

21. The ternary position encoder according to claim 20, wherein the ternary code and the sensors are arranged such that the code word follows a Gray code sequence over multiple revolutions of the first and second members.

22. The ternary position encoder according to claim 19, wherein the sensors are spaced at equal angular intervals along at least a portion of the track.

23. The ternary position encoder according to claim 19, wherein the ternary code elements comprise contact segments that are maintained at one of three possible voltage states, each voltage state representing a different ternary state.

24. The ternary position encoder according to claim 19, wherein each ternary code element comprises a segment which has one of three possible magnetic states, each magnetic state representing a different ternary state.

25. A quaternary, absolute digital position encoder, comprising:
- a first member having thereon a circular track with a quaternary code extending therealong; and
- a second member supported for relative movement with respect to the first member, the second member having thereon a plurality of quaternary sensors which are positioned adjacent to the track and configured to read the quaternary code, each of the quaternary sensors comprising a pair of angularly-aligned photodetectors that are illuminated by a common light source, each quaternary sensor corresponding to a respective quaternary digit of a code word;
- wherein the quaternary code and the sensors are arranged such that each value of the code word corresponds uniquely to a relative position of the first and second members.

26. The quaternary position encoder according to claim 25, wherein the quaternary code and the sensors are arranged such that the code word follows a Gray code sequence when the first and second members are moved relative to each other.

27. The quaternary position encoder according to claim 26, wherein the quaternary code and the sensors are arranged such that the code word follows a Gray code sequence over multiple revolutions of the first and second members.

28. The quaternary position encoder according to claim 25, wherein the sensors are spaced at equal angular intervals along the track.

29. The digital position encoder according to claim 25, wherein the number of said quaternary sensors is 4, and the number of unique values of the code word is 256.

* * * * *